(12) United States Patent
Koo et al.

(10) Patent No.: US 7,692,245 B2
(45) Date of Patent: Apr. 6, 2010

(54) THIN FILM TRANSISTOR AND FLAT PANEL DISPLAY DEVICE COMPRISING THE SAME

(75) Inventors: Jae-Bon Koo, Suwon-si (KR);
Kyong-Do Kim, Suwon-si (KR);
Min-Chul Suh, Suwon-si (KR);
Yeon-Gon Mo, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 633 days.

(21) Appl. No.: 11/195,859

(22) Filed: Aug. 3, 2005

(65) Prior Publication Data
US 2006/0027806 A1    Feb. 9, 2006

(30) Foreign Application Priority Data
Aug. 5, 2004    (KR) .................. 10-2004-0061671

(51) Int. Cl.
*H01L 27/01* (2006.01)
(52) U.S. Cl. .................. 257/350; 257/59; 257/72; 257/84; 257/296; 257/401
(58) Field of Classification Search .......... 257/350, 257/59, 72, 84, 296, 401
See application file for complete search history.

(56) References Cited

U.S. PATENT DOCUMENTS 7,038,278 B2 *   5/2006   Tsujimura et al. ............ 257/350

FOREIGN PATENT DOCUMENTS

| JP | 2003-007461 | 1/2003 |
|---|---|---|
| JP | 2003-282256 | 10/2003 |
| JP | 2004-048036 | 2/2004 |

OTHER PUBLICATIONS

*Office Action* from the Japanese Patent Office issued in Applicant's corresponding Japanese Patent Application No. 2005-187003 dated Oct. 23, 2007.

* cited by examiner

*Primary Examiner*—Long Pham
(74) *Attorney, Agent, or Firm*—Robert E. Bushnell, Esq.

(57) ABSTRACT

In a thin film transistor and a flat panel display device having the same, cross-talk is minimized. The flat panel display device includes a substrate, a first thin film transistor, a second thin film transistor, and a display element. The first thin film transistor includes: a first gate electrode formed on the substrate; a first electrode insulated from the first gate electrode; a second electrode insulated from the first gate electrode and surrounding the first electrode in the same plane; and a first semiconductor layer insulated from the first gate electrode and contacting the first electrode and the second electrode. The second thin film transistor includes: a second gate electrode formed on the substrate and electrically connected to one of the first electrode and the second electrode; a third electrode insulated from the second gate electrode; a fourth electrode insulated from the second gate electrode and surrounding the third electrode in the same plane; and a second semiconductor layer insulated from the second gate electrode and contacting the third electrode and the fourth electrode.

23 Claims, 11 Drawing Sheets

THIN FILM TRANSISTOR AND FLAT PANEL DISPLAY DEVICE COMPRISING THE SAME

CLAIM OF PRIORITY

This application makes reference to, incorporates the same herein, and claims all benefits accruing under 35 U.S.C. §119 earlier filed application entitled FLAT PANEL DISPLAY DEVICE, in the Korean Intellectual Property Office on Aug. 5, 2004 and there duly assigned Serial No. 10-2004-0061671.

BACKGROUND OF THE INVENTION

1. Technical Field

The present invention relates to a thin film transistor (TFT) and a flat panel display device comprising the same, and more particularly, to a TFT and a flat panel display device having a TFT in which cross-talk is minimized.

2. Related Art

In an inverted coplanar thin film transistor (TFT), gate electrodes are formed on a substrate, source electrodes and drain electrodes are formed above the gate electrodes, and a gate insulating layer is interposed between the source electrode and the gate electrode, and between the drain electrode and the gate electrode so that the source electrodes and the drain electrodes are insulated from the gate electrodes. A semiconductor layer contacts the source electrodes and the drain electrodes. The source electrodes and the drain electrodes may be interchanged.

In the above structure, the semiconductor layer is not patterned but is formed as a single body with two adjacent thin film transistors (TFTs). In this case, cross-talk by means of which adjacent TFTs affect one another due to leakage current and the like may occur. Thus, in order to prevent cross-talk from occurring, the semiconductor layer should be patterned so as to be separately used by each TFT. However, in the case of an organic TFT using an organic semiconductor layer as the semiconductor layer, it is very difficult to pattern the semiconductor layer, and even if the organic semiconductor layer is patterned, electrical characteristics of the organic semiconductor layer are degraded.

SUMMARY OF THE INVENTION

The present invention provides a thin film transistor (TFT) and a flat panel display device having a TFT, in which cross-talk is minimized.

According to an aspect of the present invention, a flat panel display device includes a substrate, a first thin film transistor, a second thin film transistor, and a display element. The first thin film transistor includes: a first gate electrode formed on the substrate; a first electrode insulated from the first gate electrode; a second electrode insulated from the first gate electrode and surrounding the first electrode in the same plane partially; and a first semiconductor layer insulated from the first gate electrode and contacting the first electrode and the second electrode. The second thin film transistor includes: a second gate electrode formed on the substrate and electrically connected to one of the first electrode and the second electrode; a third electrode insulated from the second gate electrode; a fourth electrode insulated from the second gate electrode and surrounding the third electrode in the same plane; a second semiconductor layer insulated from the second gate electrode and contacting the third electrode and the fourth electrode; and a display element including a pixel electrode electrically connected to one of the third electrode and the fourth electrode.

The first semiconductor layer and the second semiconductor layer are, preferably, formed of the same material in the same plane.

The first through fourth electrodes are, preferably, formed above the first gate electrode and the second gate electrode.

The first gate electrode is, preferably, disposed above or below the first and second electrodes so as to correspond to a space between the first electrode and the second electrode, and the second gate electrode is, preferably, disposed above or below the third and fourth electrodes so as to correspond to a space between the third electrode and the fourth electrode.

The third electrode is, preferably, a second drain electrode, the fourth electrode is, preferably, a second source electrode, and a third electrode is, preferably, connected to the pixel electrode.

The flat panel display device may further include a first capacitor electrode connected to the second gate electrode, and a second capacitor electrode connected to the fourth electrode.

The second gate electrode and the first capacitor electrode are, preferably, formed as a single body, and the fourth electrode and the second capacitor electrode are, preferably, formed as a single body.

The first through fourth electrodes are, preferably, formed above the first gate electrode and the second gate electrode, and a gate insulating layer is, preferably, further formed on the entire surface of the substrate so as to cover the first gate electrode, the second gate electrode, and the first capacitor electrode.

The first electrode is, preferably, a first drain electrode, and the second electrode is, preferably, a first source electrode.

The semiconductor layers are, preferably, formed on the first through fourth electrodes, a contact hole is, preferably, formed in the gate insulating layer so as to expose a portion of the first capacitor electrode, a protrusion that protrudes from the first electrode through an opening of the second electrode surrounding the first electrode in the same plane is, preferably, formed in the first electrode, and the protrusion and the first capacitor electrode are, preferably, connected to each other via the contact hole.

The first through fourth electrodes are, preferably, formed above the semiconductor layers, a contact hole is, preferably, formed in the gate insulating layer and the semiconductor layers to expose a portion of the first capacitor electrode, a protrusion that protrudes from the first electrode through an opening of the second electrode surrounding the first electrode in the same plane is, preferably, formed in the first electrode, and the protrusion and the first capacitor electrode is, preferably, connected to each other via the contact hole.

A protective layer may be further formed on the entire surface of the substrate so as to cover the first gate electrode, the second gate electrode, the first through fourth electrodes, the first capacitor electrode, the second capacitor electrode, and the semiconductor layers, and the pixel electrode may be formed above the protective layer.

The semiconductor layers are, preferably, organic semiconductor layers.

Light generated in the display element is, preferably, emitted away from the substrate.

The display element is, preferably, an electroluminescence element.

According to another aspect of the present invention, there is provided a thin film transistor(TFT) comprising a first electrode, a second electrode surrounding the first electrode in the same plane partially, a semiconductor layer contacting the first electrode and the second electrode, and a gate electrode insulated from the first electrode, the second electrode and the semiconductor layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Exemplary embodiments of the present invention will now be described with reference to the accompanying drawings.

As described above, when a semiconductor layer, in particular, an organic semiconductor layer, is formed as a single body with two or more adjacent thin film transistors (TFTs), cross-talk by means of which adjacent TFTs affect one another due to leakage current and the like may occur.

In order to prevent cross-talk from occurring, the present invention proposes a flat panel display device having a thin film transistor (TFT) in which one of a source electrode and a drain electrode surrounds the other electrode in the same plane.

Figure 1:
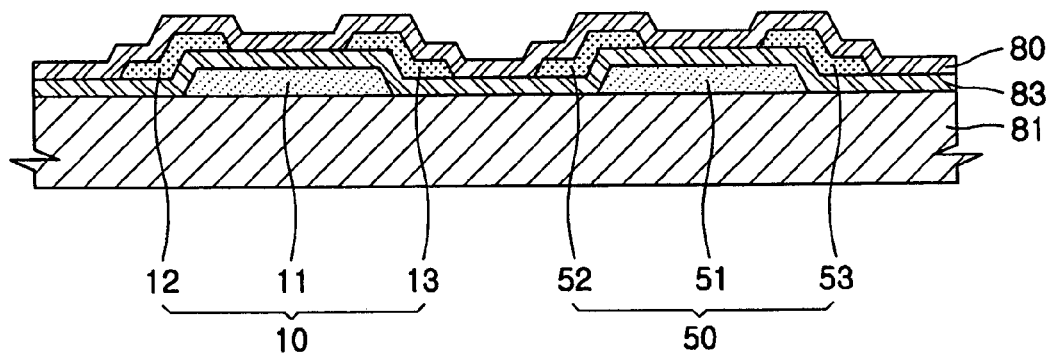
FIG. 1 is a schematic cross-sectional view of an inverted coplanar thin film transistor (TFT)

FIG. 1 is a schematic cross-sectional view of an inverted coplanar thin film transistor (TFT). Referring to FIG. 1, gate electrodes 11 and 51 are formed on a substrate 81, source electrodes 12 and 52 and drain electrodes 13 and 53 are formed above the gate electrodes 11 and 51, respectively, and a gate insulating layer 83 is interposed between the source electrode 12 and the gate electrode 11, between the drain electrode 13 and the gate electrode 11, between the source electrode 52 and the gate electrode 51, and between the drain electrode 53 and the gate electrode 51 so that the source electrodes 12 and 52 and the drain electrodes 13 and 53 are insulated from the gate electrodes 11 and 51. A semiconductor layer 80 contacts the source electrodes 12 and 52 and the drain electrodes 13 and 53. The source electrodes 12 and 52 and the drain electrodes 13 and 53 may be interchanged.

In the above structure, the semiconductor layer 80 is not patterned but is formed as a single body with two adjacent thin film transistors (TFTs) 10 and 50. In this case, cross-talk by means of which adjacent TFTs affect one another due to leakage current and the like may occur. Thus, in order to prevent cross-talk from occurring, the semiconductor layer 80 should be patterned so as to be separately used by each TFT. However, in the case of an organic TFT using an organic semiconductor layer as the semiconductor layer 80, it is very difficult to pattern the semiconductor layer 80, and even if the organic semiconductor layer is patterned, electrical characteristics of the organic semiconductor layer are degraded.

Figure 2:
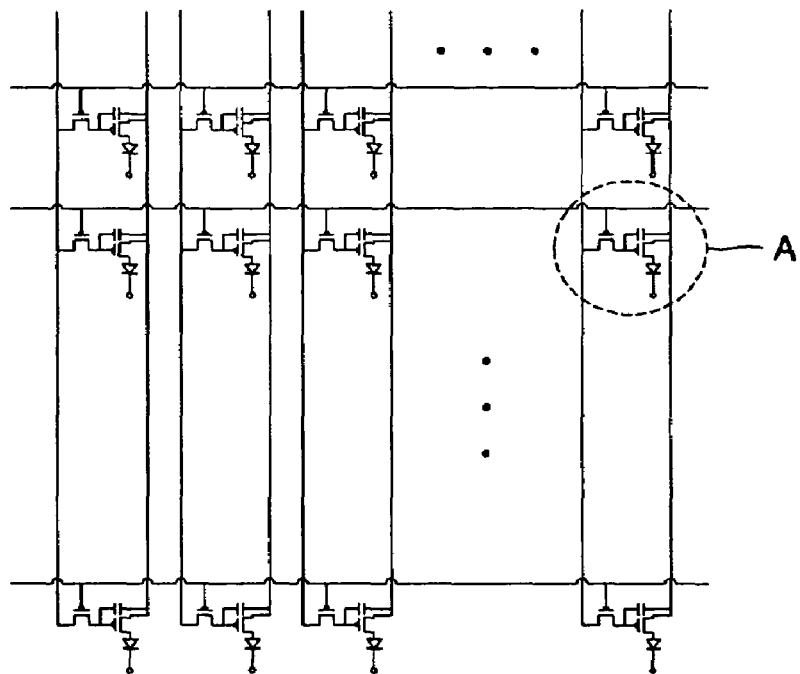
FIG. 2 is a schematic circuit diagram of an active matrix electroluminescence display device according to an embodiment of the present invention.
Figure 3:
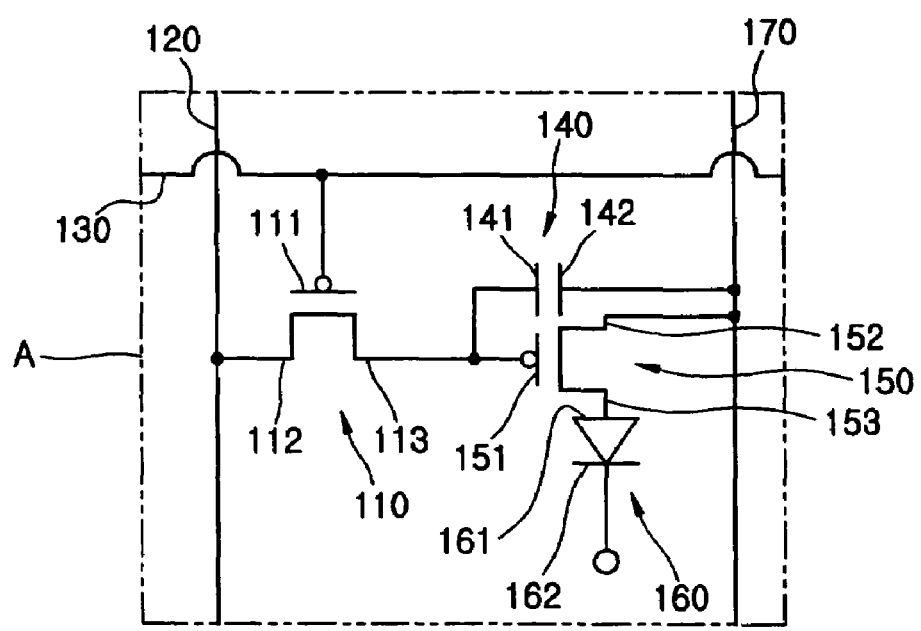
FIG. 3 a circuit diagram of a portion A shown in FIG. 2.
Figure 4:
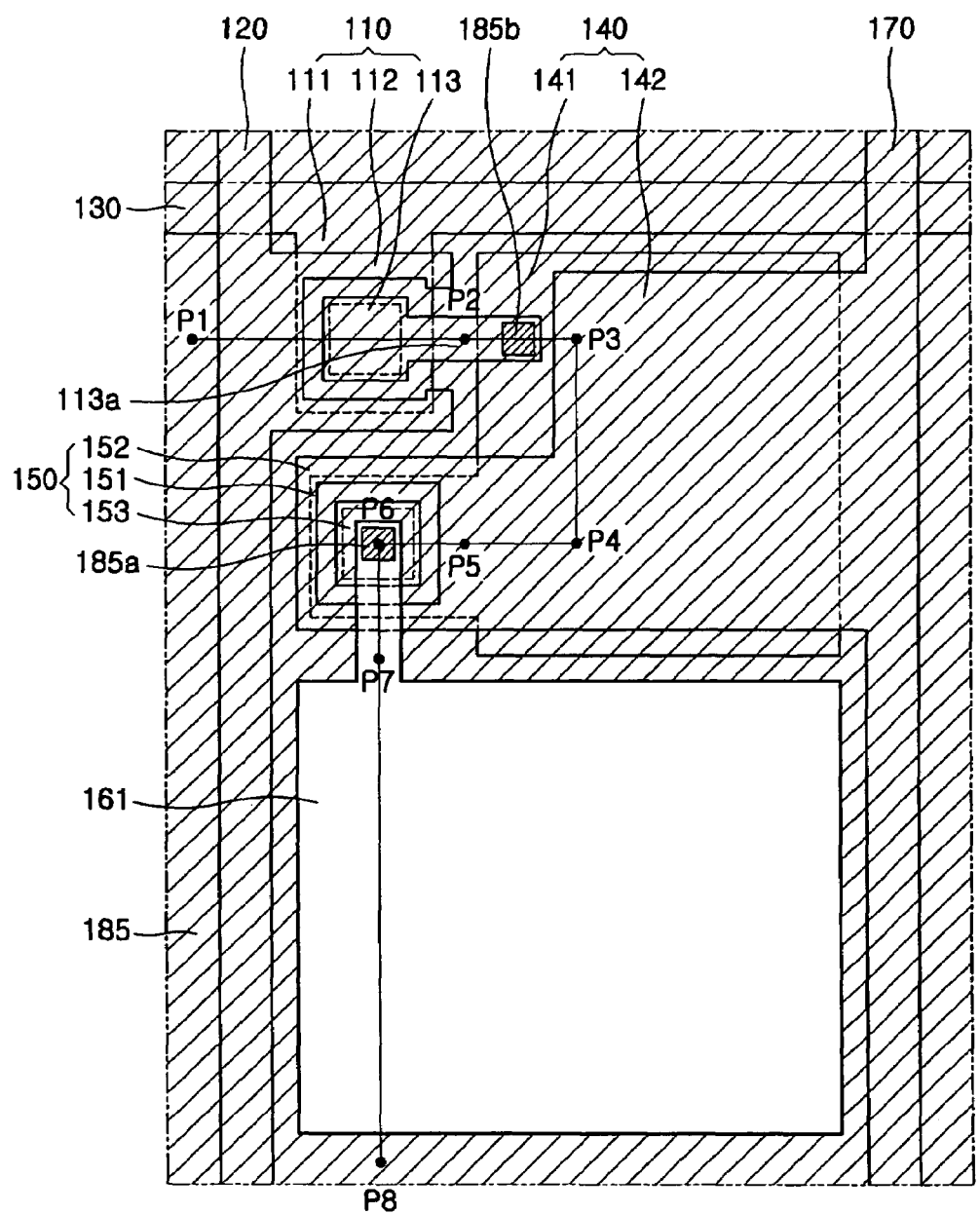
FIG. 4 is a schematic plane view of the portion A shown in FIG. 2.
Figure 5:
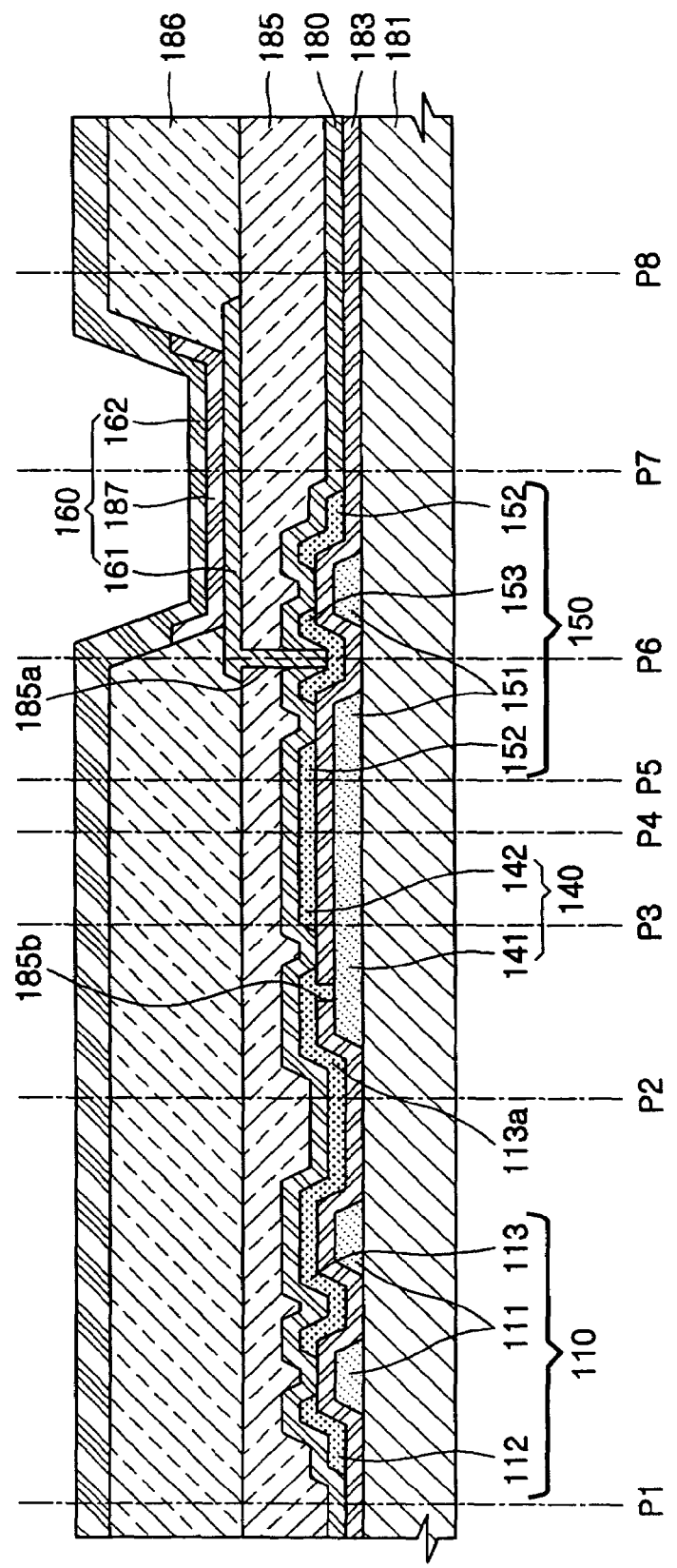
FIG. 5 is a schematic cross-sectional view, taken along points P1 through P8 of FIG. 4, of a subpixel unit of the active matrix electroluminescence display device.

FIG. 2 is a schematic circuit diagram of an active matrix electroluminescence display device according to an embodiment of the present invention, FIG. 3 a circuit diagram of a portion A shown in FIG. 2, FIG. 4 is a schematic plane view of the portion A shown in FIG. 2, and FIG. 5 is a schematic cross-sectional view, taken along points P1 through P8 of FIG. 4, of a subpixel unit of the active matrix electroluminescence display device.

Referring to FIGS. 2 thru 5, the active matrix electroluminescence display device according to an embodiment of the present invention comprises a first TFT 110 disposed above a substrate 181. In other words, the active matrix electroluminescence display device further comprises a first gate electrode 111, a first electrode 113 insulated from the first gate electrode 111, a second electrode 112 which is insulated from the first gate electrode 111 by insulating layer 183 and which partially surrounds the first electrode 113 in the same plane, and a semiconductor layer 180, which is insulated from the first gate electrode 111 and which contacts the first electrode 113 and the second electrode 112. In particular, the semiconductor layer 180 may be an organic semiconductor layer, and this variation can be applied to embodiments that will be described later.

A second TFT 150 electrically connected to the first TFT 110 is disposed above the substrate 181. In other words, the active matrix electroluminescence display device further comprises a second gate electrode 151 formed above the substrate 181 and electrically connected to one of the first electrode 113 and the second electrode 112, a third electrode 153 insulated from the second gate electrode 151, a fourth electrode 152 which is insulated from the second gate electrode 151 and which surrounds the third electrode 153 in the same plane, and semiconductor layer 180 which is insulated from the second gate electrode 151 and contacts the third electrode 153 and the fourth electrode 152. In this case, the semiconductor layer 180 may be formed of the same material in the same plane, as shown in FIG. 5.

A display element having a pixel electrode 161 electrically connected to one of the third electrode 153 and the fourth electrode 152 is disposed. The pixel electrode 161 is electrically connected to one of the third electrode 153 and the fourth electrode 152 of the second TFT 150. FIGS. 4 and 5 show a flat panel display device wherein the pixel electrode 161 is connected to the third electrode 153. In other words, the semiconductor layer 180 is a p-type semiconductor layer, the third electrode 153 is a second drain electrode, the fourth electrode 152 is a second source electrode, and the pixel electrode 161 is connected to the third electrode 153. The case where the third electrode 153 is a drain electrode will now be described, but the present invention is not limited thereto.

The display element having the pixel electrode 161 may have a variety of shapes. The flat panel display device according to the present embodiment refers to the case where an electroluminescence display element is used as the display element.

Referring to FIG. 4, the pixel electrode 161 is disposed where the first TFT 110, the second TFT 150, and a storage capacitor 140 are not disposed. That is, the flat panel display device is a rear emission display device in which light generated in the display element connected to the pixel electrode 161 is emitted through the substrate 181. However, this structure is shown for explanatory convenience. The pixel electrode 161 may be formed above the first TFT 110, the storage capacitor 140, and the second TFT 150, as shown in FIG. 5, unlike FIG. 4. This variation can be applied to embodiments that will be described later.

In the above-described structure, the second TFT 150 has a structure in which the fourth electrode 152 surrounds the third electrode 153 in the same plane, such that a channel formed on the semiconductor layer 180 in contact with each electrode is formed only between the two electrodes 152 and 153. Furthermore, current flows only between the third electrode 153 and the fourth electrode 152 which surrounds the third electrode 153 in the same plane, and cross-talk between adjacent thin film transistors (TFTs) can be prevented from occurring even though the semiconductor layer 180 is not patterned.

In the case of the second TFT 150, the third electrode 153 surrounded by the fourth electrode 152 in the same plane is connected to the pixel electrode 161 formed above the second TFT 150. Thus, the third electrode 153 can be simply connected to the pixel electrode 161 only via one contact hole 185a. However, in the case of the first TFT 110, other elements connected to the first TFT 110 are not formed above the first TFT 110 but are formed in the same plane as that of the first TFT 110 or in a plane under the first TFT 110. Thus, the first TFT 110 may have a different structure from that of the second TFT 150 so that the first TFT 110 is simply connected to other elements.

Figure 6:
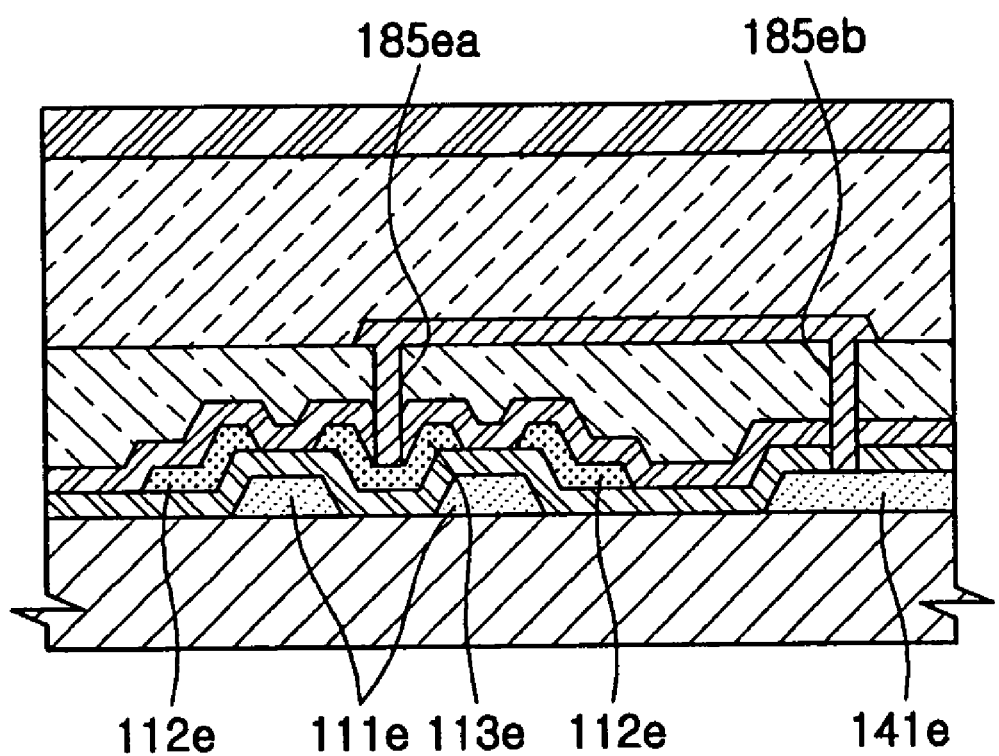
FIG. 6 is a schematic cross-sectional view of a comparison example of a subpixel unit of the active matrix electroluminescence display device shown in FIG. 2.

In other words, as shown in FIG. 6, even when the first TFT 110 has a structure in which a second electrode 112e surrounds a first electrode 113e in the same plane, in order to connect the first electrode 113e and another element not formed above the first TFT 110, but in the same plane as that of the first TFT 110 or in the plane under the first TFT 110, while the first electrode 113e doe not contact the second electrode 112e, an interconnection having a bridge shape should be formed. That is, the interconnection having the bridge shape is formed in a contact hole 185ea formed to expose a portion of the first electrode 113e, in a plane above the first TFT 110 insulated from the first electrode 113e, and in a contact hole 185eb formed to expose a portion of the another element 241e. As the result, a structure of the first TFT 110 becomes complicated.

Thus, as shown in FIGS. 4 and 5, the second electrode 112 partially surrounds the first electrode 113 in the same plane, such that a connection structure of the other elements not formed above the first electrode 113, but in the same plane as that of the first electrode 113 or in the plane under the first electrode 113, can be simplified. That is, the second electrode 112 partially surrounds the first electrode 113 in the same plane, and a protrusion 113a which protrudes from the first electrode 113 through an opening of the second electrode 112 is formed in the first electrode 113, such that the first electrode 113 can be simply connected to other elements formed in the same plane as that of the first electrode 113 or on a lower plane of the first electrode 113 using the protrusion 113a.

In this case, one of the first electrode 113 and the second electrode 112 is a source electrode, and the other electrode thereof is a drain electrode. Thus, in FIGS. 4 and 5, the first electrode 113 is a first drain electrode, and the second electrode 112 is a first source electrode. Contrary to this, a structure in which the first electrode 113 is a first source electrode and the second electrode 112 is a first drain electrode will be described later in an additional embodiment.

As described above, the second electrode 112 partially surrounds the first electrode 113 in the same plane, such that a channel formed on the semiconductor layer 180 which contacts each of the first electrode 113 and the second electrode 112 is formed only between the two electrodes 112 and 113, and current flows only between the first electrode 113 and the second electrode 112 that partially surrounds the first electrode 113 in the same plane. Thus, even though the semiconductor layer is not patterned, cross-talk between adjacent TFTs can be prevented. In addition, the second electrode 112 partially surrounds the first electrode 113 in the same plane, such that the first electrode 113 can be simply connected to external elements via an opening of the second electrode 112, and the structure of the flat panel display device can be more simplified.

The TFTs 110 and 150 having the above structure may be inverted coplanar TFTs in which the semiconductor layer 180 is formed above the first thru fourth electrodes 113, 112, 153, and 152. Contrary to this, the TFTs 110 and 150 maybe inverted, staggered TFTs in which the semiconductor layer 180 is formed under the first thru fourth electrodes 113, 112, 153, and 152, or may be staggered TFTs in which the first gate electrode 111 and the second gate electrode 151 are formed above the first thru fourth electrodes 113, 112, 153, and 152. That is, the TFTs 110 and 150 may be included in all types of devices in which one of a source electrode and a drain electrode surrounds the other electrode in the same plane partially or completely. This variation can be applied to embodiments that will be described later.

For explanatory convenience, the case where the TFTs are inverted, coplanar or inverted, staggered TFTs, in which the first thru fourth electrodes 113, 112, 153, and 152 are formed above the first gate electrode 111 and the second gate electrode 151, will be described in the present embodiment and embodiments that will be described later. In particular, the case where the flat panel display device includes an inverted, coplanar TFT will be described in the present embodiment, and the case where the flat panel display device includes an inverted, staggered TFT will be described later in an additional embodiment.

The first gate electrode 111 may be disposed above or below the first and second electrodes 113 and 112 so as to correspond to a space between the first electrode 113 and the second electrode 112, and the second gate electrode 151 may be disposed above or below the third and fourth electrodes 153 and 152 so as to correspond to a space between the third electrode 153 and the fourth electrode 152. In other words, the first gate electrode 111 and the second gate electrode 112 may be formed in a donut shape in which middle portions of the first gate electrode 111 and the second gate electrode 151 are empty.

This is due to the fact that, if the first gate electrode 111 is not formed in a donut shape and forms a capacitor structure with the first electrode 113 and the second electrode 112 which surrounds the first electrode 113 in the same plane, a parasitic capacitance between the first electrode 113 and the first gate electrode 111 may occur. This is applied to the second gate electrode 151 and the third electrode 153.

As described above, since the flat panel display device according to the present embodiment may further comprise storage capacitor 140, a first capacitor electrode 141 of the storage capacitor 140 is connected to the second gate electrode 151, and a second capacitor electrode 142 of the storage capacitor 140 is connected to the fourth electrode 152. In this case, as shown in FIGS. 4 and 5, the second gate electrode 151 and the first capacitor electrode 141 are formed as a single body, and the fourth electrode 152 and the second capacitor electrode 142 are formed as a single body.

In the above-described structure, a gate insulating layer 183 may be further formed on the entire surface of the substrate 181 to cover the first gate electrode 111, the second gate electrode 151, and the first capacitor electrode 141. A contact hole 185b may be formed on the gate insulating layer 183 so as to expose a portion of the first capacitor electrode 141.

In this case, as previously described, the first capacitor electrode 141 of the storage capacitor 140 is connected to the first TFT 110. Thus, when the first electrode 113 of the first TFT 110 is a first drain electrode as in the present embodiment, the first capacitor electrode 141 is connected to the first electrode 113. In this case, the second electrode 112 partially surrounds the first electrode 113 in the same plane, and a protrusion 113a which protrudes from the first electrode 112 through an opening of the second electrode 112 is formed in the first electrode 113, such that the first electrode 113 and the first capacitor electrode 141 are connected to each other by using the protrusion 113a and the contact hole 185b formed in the gate insulating layer 183.

A protective layer 186 maybe further formed on the entire surface of the substrate 181 so as to cover the semiconductor layer 180, and the pixel electrode 161 may be formed on the protective layer 186. In this case, a pixel definition layer may be formed using the protective layer 186.

In a flat panel display device including a TFT having the above structure and a display element connected to and driven by the TFT, the display element may be, for example, an electroluminescence element 160 as shown in FIG. 5. A flat panel display device having the electroluminescence element 160 will now be briefly described.

The electroluminescence display device comprises a plurality of pixels including subpixels emitting red, green and blue from an emission layer. Each subpixel producing red, green and blue includes an electroluminescence element, which is a self-emission element, and at least one or more thin film transistors (TFTs) connected to the electroluminescence element. As described above, the TFTs may be TFTs in which one of a source electrode and a drain electrode surrounds the other electrode in the same plane. In this case, the TFTs are connected to the electroluminescence element in the above-described shape.

The electroluminescence element is a light-emitting element driven by a current and emits red, green or blue light according to the flow of current between two electrodes included in the electroluminescence display device, thereby forming a predetermined image. The structure of the electroluminescence element will now be briefly described. As described above, the electroluminescence element comprises a pixel electrode 161 connected to the third electrode 153 of the TFT, an opposite electrode 162 formed to cover all pixels or to correspond to each pixel, and an intermediate layer 187 including at least an emission layer disposed between the pixel electrode 161 and the opposite electrode 162. The present invention is not limited to the above-described structure but may have a variety of structures.

The pixel electrode 161 serves as an anode electrode, and the opposite electrode 162 serves as a cathode electrode. In this respect, the pixel electrode 161 and the opposite electrode 162 may have opposite polarities.

The pixel electrode 161 may be a transparent electrode or a reflection electrode. When the pixel electrode 161 is a transparent electrode, the pixel electrode 161 may be formed of ITO, IZO, ZnO or $In_2O_3$. When the pixel electrode 161 is a reflection electrode, after a reflection layer of Ag, Mg, Al, Pt, Pd, Au, Ni, Nd, Ir, Cr or a compound thereof is formed, the pixel electrode 161 may be formed of ITO, IZO, ZnO or $In_2O_3$ disposed on the reflection layer.

The opposite electrode 162 may also be a transparent electrode or a reflection electrode. When the opposite electrode 162 is a transparent electrode, Li, Ca, LiF/Ca, LiF/Al, Al, Ag, Mg or a compound thereof is deposited on an intermediate layer, an auxiliary electrode layer or a bus electrode line may be formed of a material, such as ITO, IZO, ZnO or $In_2O_3$, used in forming the transparent electrode on a deposited resultant. When the opposite electrode 162 is a reflection electrode, the opposite electrode 162 is formed by depositing Li, Ca, LiF/Ca, LiF/Al, Al, Mg or a compound thereof on the entire surface of the electroluminescence display element. However, the present invention is not limited to this, and the pixel electrode 161 and the opposite electrode 162 may be formed of an organic material, such as conductive polymer etc.

Electroluminescence elements are classified into inorganic electroluminescence elements or organic electroluminescence elements depending on whether the intermediate layer 187 is an inorganic layer or an organic layer. In the latter case, the intermediate layer 187 may be a low molecular organic film or a high molecular organic film.

When the intermediate layer 187 is a low molecular organic film, the intermediate layer 187 may be a hole injection layer (HIL), a hole transport layer (HTL), an emission layer (EML), an electron transport layer (ETL), and an electron injection layer (EIL) in a single or composite structure. The intermediate layer 187 may be formed of an organic material, such as copper phthalocyanine (CuPc), N,N'-Di (naphthalene-1-yl)-N,N'-diphenyl-benzidine (NPB) or tris-8-hydroxyquinoline aluminum ($Alq_3$), or the like. The low molecular organic film may be formed by heating an organic substance in a vacuum state, and depositing the organic substance. The structure of the intermediate layer 187 is not limited to this, and the intermediate layer 187 may be one of a variety of layers.

When the intermediate layer 187 is a high molecular organic film, the intermediate layer 187 may be usually an HTL and an EML. A high molecular HTL may be formed by ink-jet printing or spin coating using poly-(2,4)-ethylene-dihydroxy thiophene (PEDOT) or polyaniline (PANI), or the like. A high molecular EML may be formed of PPV, soluble PPV's, cyano-PPV or polyfluorene, or the like. A color pattern of the EML may be formed using a general method, such as ink-jet printing, spin coating or thermal transfer using a laser. In the case of the high molecular organic film, the structure of the intermediate layer 187 is not limited to the above, and the intermediate layer 187 may be one of a variety of layers as necessary.

In the case of the inorganic electroluminescence element, the intermediate layer 187 may be an inorganic film, and comprises an emission layer and an insulating layer interposed between the emission layer and an electrode. The structure of the intermediate layer 187 is not limited to this, and the intermediate layer 187 may be one of a variety of layers as necessary.

The emission layer may be formed of a metallic sulfide such as ZnS, SrS or CaS, an alkali-earth potassium sulfide such as $CaGa_2S_4$ or $SrGa_2S_4$, and emission central atoms such as transition metal including Mn, Ce, Th, Eu, Tm, Er, Pr, and Pb etc. or alkali-rare earth metals.

In the electroluminescence element having the above-described structure, as described above, a drain electrode of a TFT in which one of a source electrode and a drain electrode surrounds the other electrode in the same plane is connected to a pixel electrode 161 of the electroluminescence element, such that a flow of current to the pixel electrode is controlled, and emission of each pixel is controlled.

The correlation between the structures of the first TFT 110 and the second TFT 150 will be described with reference to FIGS. 2 through 5. The second electrode 112 of the first TFT 110 is connected to a driving circuit (not shown) by a first conducting line 120, the first gate electrode 111 of the first TFT 110 is connected to the driving circuit by a second conducting line 130, and the first electrode 113 of the first TFT 110 is connected to the first capacitor electrode 141 of the storage capacitor 140 and the second gate electrode 151 of the second TFT 150. In this structure, the second electrode 112 may be a first source electrode of the first TFT 110, and the first electrode 113 maybe a first drain electrode of the first TFT 110. In addition, the first conducting line 120 may be a data line which transmits data, and the second conducting line 130 may be a scan line. In this case, the first TFT 110 serves as a switching transistor, and the second TFT 150 serves as a driving transistor. Two or more transistors may be used in the above circuit. The case where two transistors, such as a switching transistor and a driving transistor, are used has been described in the present embodiment, and will be described in subsequent embodiments.

The second capacitor electrode 142 of the storage capacitor 140 and the fourth electrode 152 of the second TFT 150 are connected to the third conducting line 170, and the third electrode 153 of the second TFT 150 is connected to the pixel electrode 161 of the electroluminescence display element 160. In the above-described structure, the fourth electrode 152 may be a second source electrode of the second TFT 150, and the third electrode 153 may be a second drain electrode of the second TFT 150 in the case where the semiconductor layer 180 is a p-type semiconductor layer. However, the present invention is not limited hereto.

In the active matrix electroluminescence display device having the above-described structure, a plurality of TFTs, such as a driving transistor and a switching transistor, are used in each subpixel. Thus, if cross-talk occurs in these TFTs, the amount of light generated in the electroluminescence element 160 is not properly controlled and, therefore, a proper image cannot be represented.

Thus, when using a TFT in which one of the source electrode and the drain electrode surrounds the other electrode in the same plane, cross-talk can be prevented without patterning the semiconductor layer so that a clearer and more precise image can be produced. In addition, in the TFT having the above structure, if necessary, the one electrode partially surrounds the other electrode in the same plane, such that a structure for connecting electrodes of the TFT to the other elements can be simplified.

Figure 7:
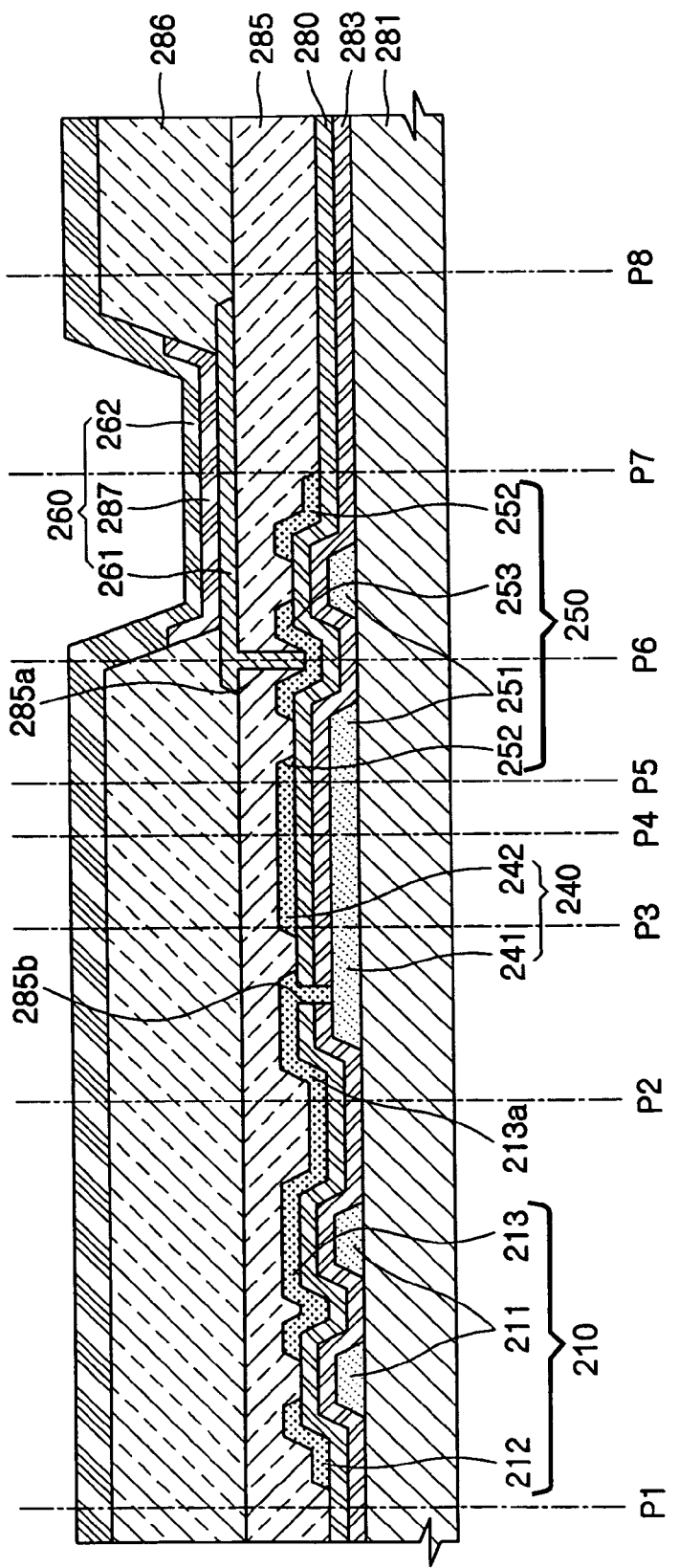
FIG. 7 a schematic cross-sectional view of a subpixel unit of an active matrix electroluminescence display device according to another embodiment of the present invention.

FIG. 7 is a schematic cross-sectional view of a subpixel unit of an active matrix electroluminescence display device according to another embodiment of the present invention.

The active matrix electroluminescence display device shown in FIG. 7 is different from the active matrix electroluminescence display device according to an embodiment of the present invention in that a first TFT 210 and a second TFT 250 are not inverted, coplanar TFTs but rather are inverted, staggered TFTs. In other words, a first electrode 213 through a fourth electrode 252 are formed on a semiconductor layer 280.

As described above, even though the inverted, staggered TFT in which the semiconductor layer 480 is not patterned in each TFT is used, the structure shown in FIG. 7 is formed using the TFT in which one of a source electrode and a drain electrode surrounds the other electrode in the same plane such that cross-talk can be prevented and a clearer and more precise image can be represented.

In addition, in the TFT having the above structure, if necessary, the one electrode partially surrounds the other electrode in the same plane, such that a structure for connecting electrodes of the TFT to the other elements can be simplified. In other words, a contact hole 285b is formed in the gate insulating layer 283 and the semiconductor layer 280 to expose a portion of the first capacitor electrode 241. A protrusion 213a, which protrudes from the first electrode 213 through an opening of the second electrode 212 partially surrounding the first electrode 213 in the same plane, is formed in the first electrode 213 such that the protrusion 213a and the first capacitor electrode 241 are connected to each other via the contact hole 285b, that is, the first electrode 213 and the first capacitor electrode 241 are simply connected to each other via the protrusion 213a and the contract hole 285b.

Figure 8:
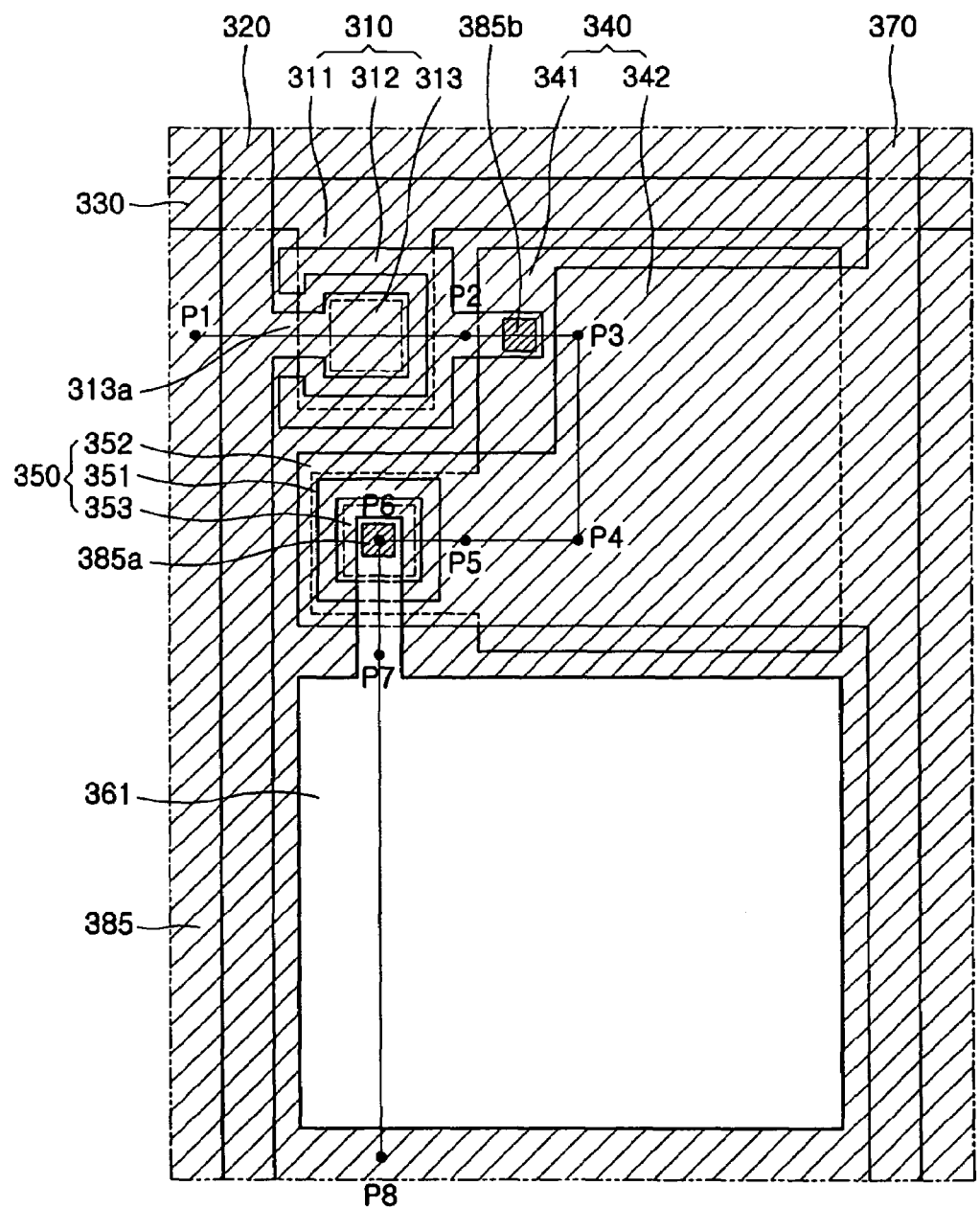
FIG. 8 is a schematic cross-sectional view of a subpixel unit of an active matrix electroluminescence display device according to another embodiment of the present invention.
Figure 9:
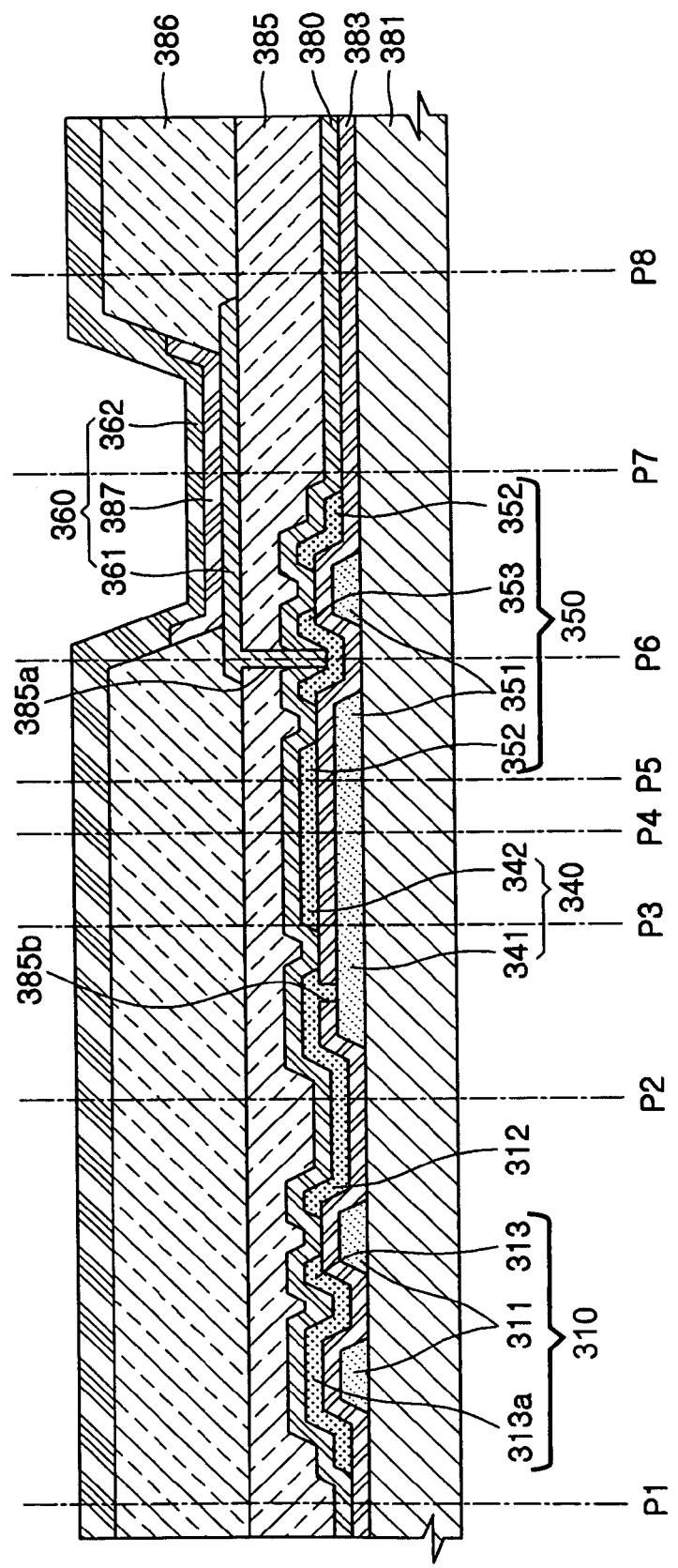
FIG. 9 is a schematic cross-sectional view, taken along points P1 through P8 of FIG. 8, of a subpixel unit of the active matrix electroluminescence display device.

FIG. 8 is a schematic cross-sectional view of a subpixel unit of an active matrix electroluminescence display device according to another embodiment of the present invention, and FIG. 9 is a schematic cross-sectional view, taken along points P1 through P8 of FIG. 8, of a subpixel unit of the active matrix electroluminescence display device.

In other words, in the previous embodiment of the present invention as seen in FIG. 5, the second electrode 112 partially surrounds the first electrode 113, the first electrode 113 is a drain electrode, the second electrode 112 is a source electrode, and the first electrode 113 is connected to the first capacitor electrode 141 of the storage capacitor 140 via an opening of the second electrode 112. The present embodiment is the same as the previous embodiment in that a second electrode 312 surrounds a first electrode 313. However, unlike in the previous embodiment, the first electrode 313 is a source electrode, the second electrode 312 is a drain electrode, the second electrode 312 is connected to a first capacitor electrode 341 of a storage capacitor 340 and is then electrically connected to a first gate electrode 351, and the third electrode 313 is connected to a second interconnection 320.

Figure 10:
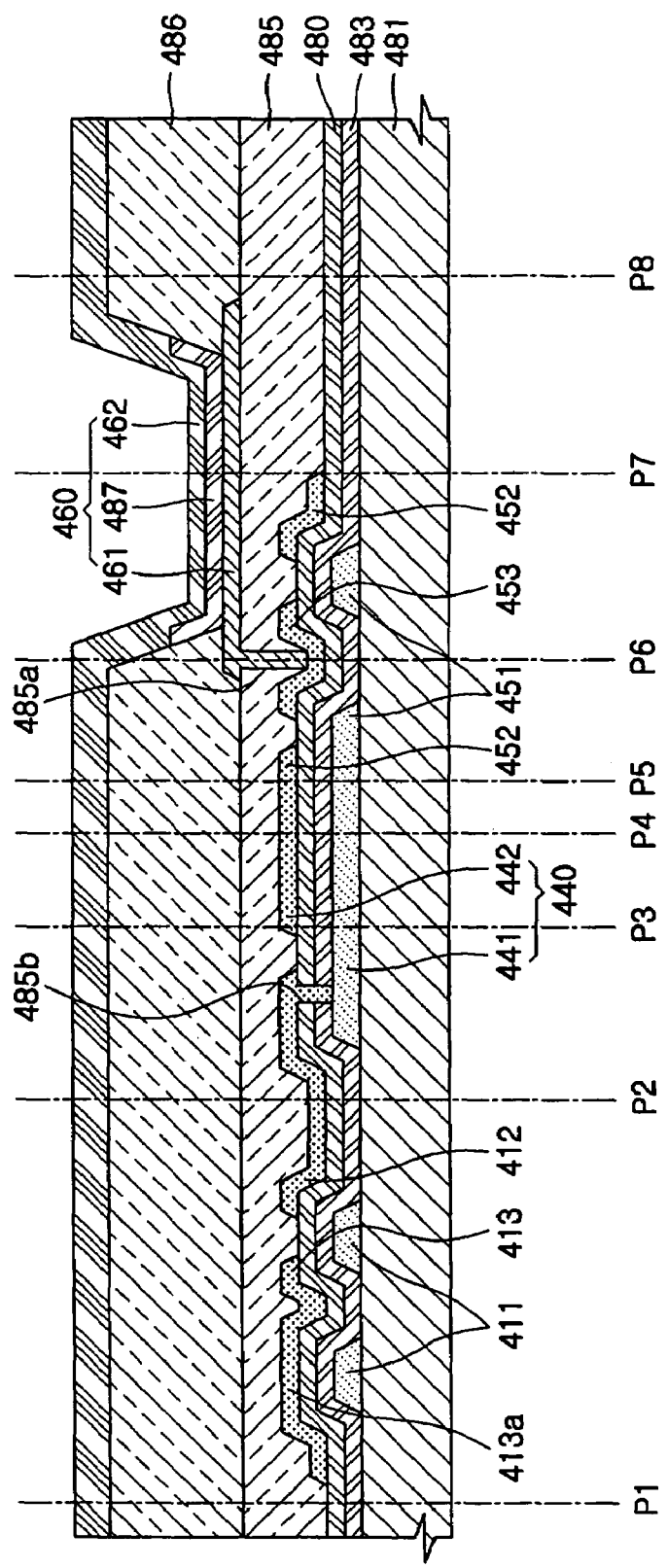
FIG. 10 is a schematic cross-sectional view of a subpixel unit of an active matrix electroluminescence display device according to another embodiment of the present invention.

The active matrix electroluminescence display device according to the present embodiment is a display device having an inverted, coplanar TFT in which a semiconductor layer 380 is formed above the first electrode 313 and a fourth electrode 352. However, like the active matrix electroluminescence display device shown in FIG. 10 according to another embodiment of the present invention, the present embodiment can be applied to a display device having an inverted staggered TFT in which a semiconductor layer 480 is formed under a first electrode 413 and a fourth electrode 452.

Figure 11:
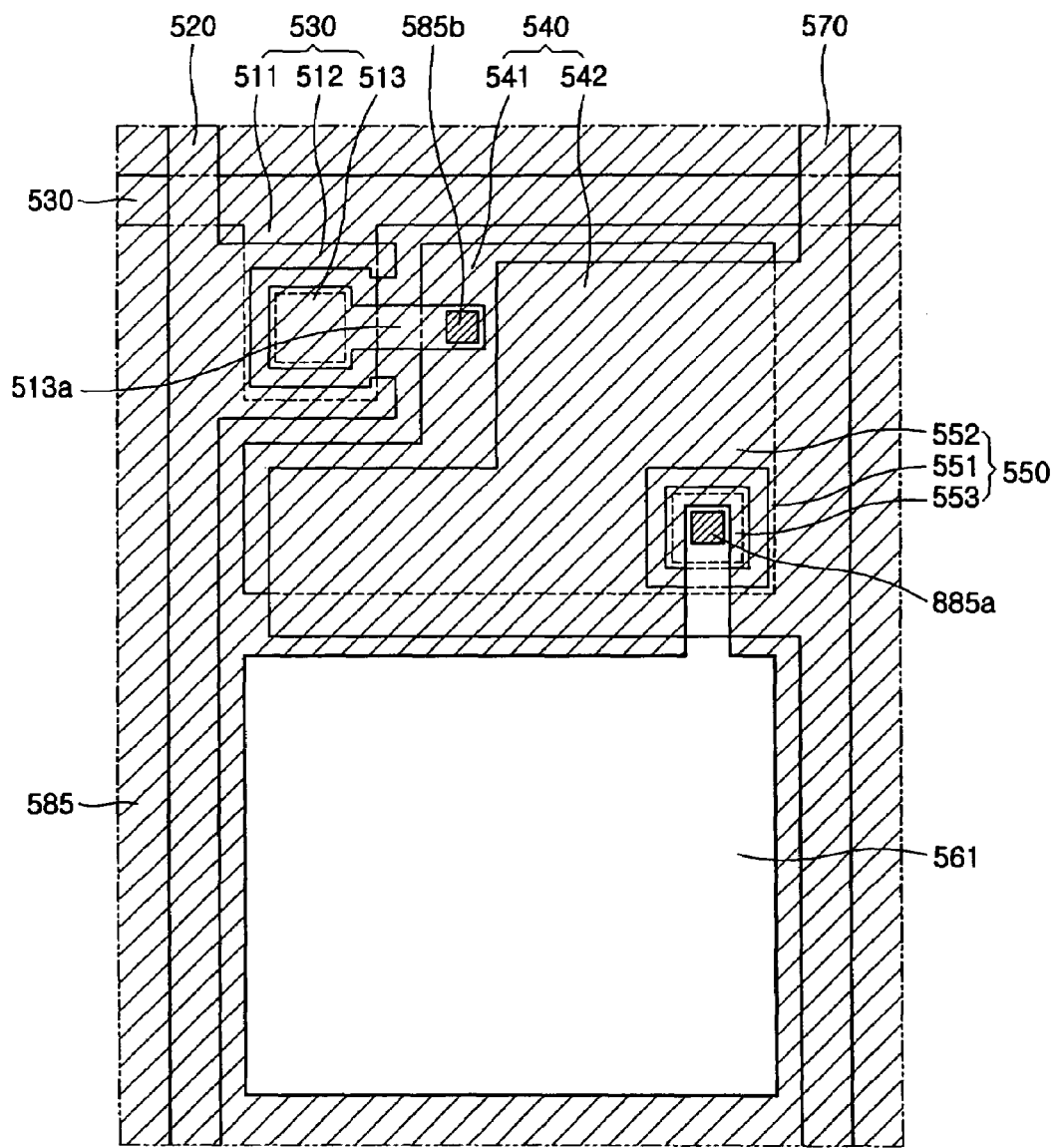
FIG. 11 is a schematic plane view of a subpixel unit of an active matrix electroluminescence display device according to another embodiment of the present invention.

FIG. 11 is a schematic plane view of a subpixel unit of an active matrix electroluminescence display device according to another embodiment of the present invention.

As described above, when a semiconductor layer is not patterned, but is formed as a single body with adjacent TFTs, cross-talk in which adjacent TFTs affect one another due to a leakage current, etc. may occur. Thus, in order to prevent cross-talk from occurring, it is good to pattern the semiconductor layer in each TFT. However, in the case of an organic TFT using an organic semiconductor layer as the semiconductor layer, it is very difficult to pattern the organic semiconductor layer and, even though the organic semiconductor layer is patterned, the electrical characteristics of the organic semiconductor layer are lowered.

Thus, in order to solve these problems, the present invention provides a flat panel display device having a TFT in which one of a source electrode and a drain electrode surrounds the other electrode in the same plane so as to expose a portion or all of the electrode. In order to minimize the possibility of cross-talk between TFTs having the above structure, as shown in FIG. 11, a first TFT 510 and a second TFT 550 may be further isolated from each other. By means of the above structure, the possibility of cross-talk between adjacent TFTs can be minimized, and a clearer and more precise image can be represented.

Figure 12:
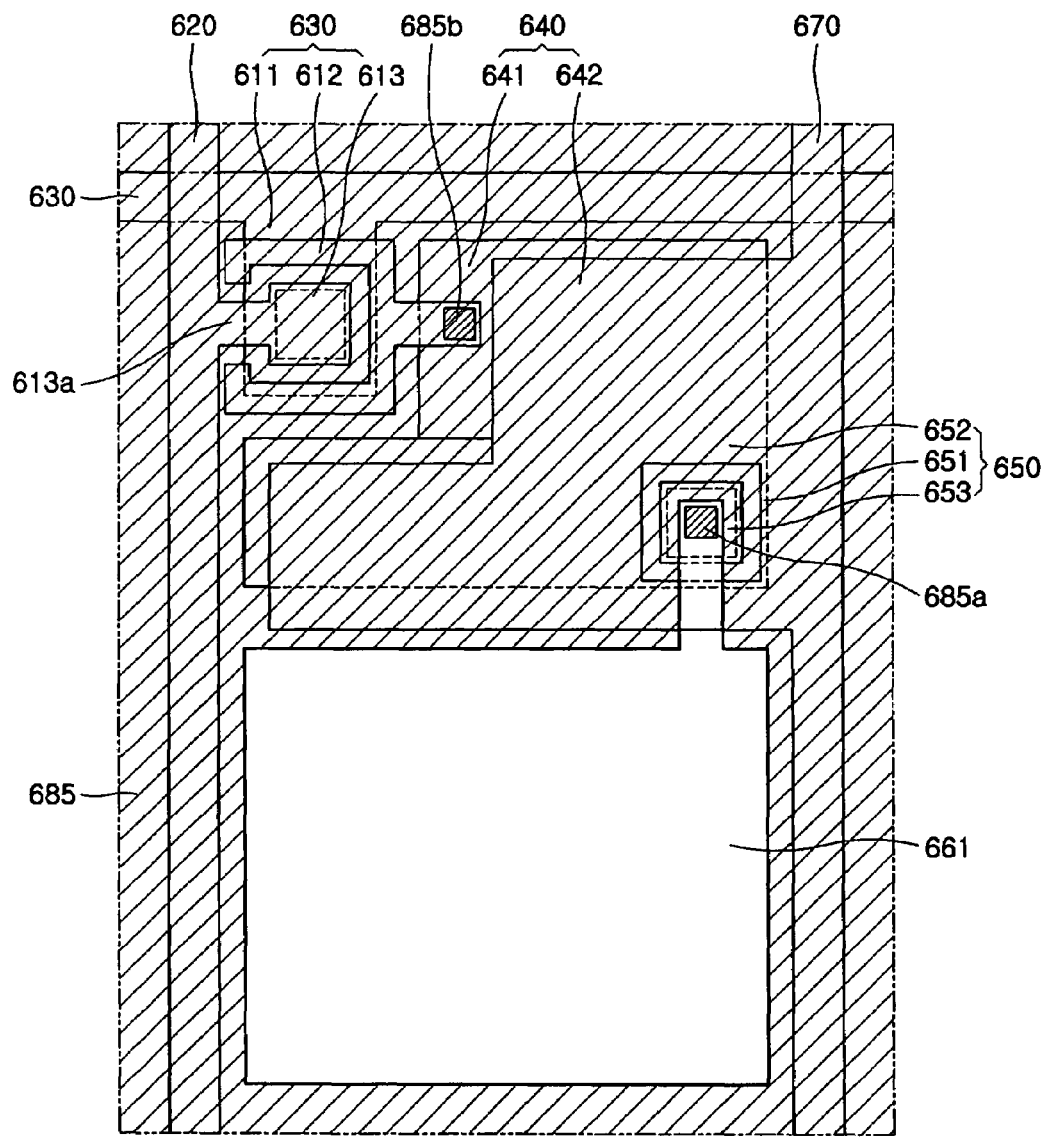
FIG. 12 is a schematic plane view of a subpixel unit of an active matrix electroluminescence display device according to another embodiment of the present invention.

In the present embodiment, as shown in FIG. 11, in the first TFT 510, a second electrode 512 partially surrounds a first electrode 513, the first electrode 513 is a drain electrode, the second electrode 512 is a source electrode, and the first electrode 513 is connected to a first capacitor electrode 141 of the storage capacitor 540 via an opening of the second electrode 512. However, as in another embodiment shown in FIG. 12, in the state where a first TFT 610 and a second TFT 650 are further isolated from each other, a first electrode 613 may be a source electrode, a second electrode 612 may be a drain electrode and may be connected to a first capacitor electrode 641 of a storage capacitor 640, the second electrode 612 may be electrically connected to a first gate electrode 651, and the first electrode 613 may be connected to a second interconnection 620.

Referring to FIGS. 4 through 12, since a TFT in which one of a source electrode and a drain electrode surrounds the other electrode in the same plane partially or completely has a larger area than that of a conventional TFT, when the flat panel display device is a front emission display device in which light generated in a display element connected to the TFT having the above structure is emitted away from a substrate of the TFT, the TFT can be very useful. However, the present invention is not limited to this structure, and the flat panel display device may be a rear emission display device or a double emission display device.

In the embodiments shown in FIGS. 2 through 12, electroluminescence elements in which two TFTs and a capacitor are electrically connected to an electroluminescence element to drive the electroluminescence display element are shown, but the present invention is not limited to such an arrangement.

As described above, the following effects can be obtained with the flat panel display device according to the present invention. First, by using a flat panel display device having a TFT in which one of a source electrode and a drain electrode surrounds the other electrode in the same plane, cross-talk between TFTs in which a semiconductor layer is not patterned can be prevented. Second, by using a structure in which a first electrode of a TFT partially surrounds a second electrode thereof in the same plane, the second electrode and other elements can contact one another simply and securely via an opening of the source electrode.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A flat panel display device, comprising:
   a substrate;
   a first thin film transistor comprising:
      a first gate electrode formed on the substrate;
      a first electrode insulated from the first gate electrode;
      a second electrode insulated from the first gate electrode and partially surrounding the first electrode in which the first and second electrodes are both in a same geometric plane; and
      a first semiconductor layer insulated from the first gate electrode and contacting the first electrode and the second electrode;
   a second thin film transistor comprising:
      a second gate electrode formed on the substrate and electrically connected to one of the first electrode and the second electrode;
      a third electrode insulated from the second gate electrode;
      a fourth electrode insulated from the second gate electrode and surrounding the third electrode in the same plane; and
      a second semiconductor layer insulated from the second gate electrode and contacting the third electrode and the fourth electrode;
   a storage capacitor connected to said first thin film transistor and said second thin film transistor; and
   a display element including a pixel electrode electrically connected to one of the third electrode and the fourth electrode,
   wherein said storage capacitor is positioned between said first thin film transistor and second thin film transistor in a same geometric plane.

2. The flat panel display device of claim 1, wherein the first semiconductor layer and the second semiconductor layer are formed of the same material in the same plane.

3. The flat panel display device of claim 1, wherein the first thru fourth electrodes are formed above the first gate electrode and the second gate electrode.

4. The flat panel display device of claim 1, wherein the first gate electrode is disposed on a plane different from a plane of the first and second electrodes so as to correspond to a space between the first electrode and the second electrode, and the second gate electrode is disposed on a plane different from a plane of the third and fourth electrodes so as to correspond to a space between the third electrode and the fourth electrode.

5. The flat panel display device of claim 1, wherein the third electrode is a second drain electrode, the fourth electrode is a second source electrode, and a third electrode is connected to the pixel electrode.

6. A flat panel display device, comprising:
   a substrate;
   a first thin film transistor comprising:
      a first gate electrode formed on the substrate;
      a first electrode insulated from the first gate electrode;
      a second electrode insulated from the first gate electrode and partially surrounding the first electrode in the same plane; and
      a first semiconductor layer insulated from the first gate electrode and contacting the first electrode and the second electrode;
   a second thin film transistor comprising:
      a second gate electrode formed on the substrate and electrically connected to one of the first electrode and the second electrode;
         a third electrode insulated from the second gate electrode;
      a fourth electrode insulated from the second gate electrode and surrounding the third electrode in the same plane;

a second semiconductor layer insulated from the second gate electrode and contacting the third electrode and the fourth electrode;

a display element including a pixel electrode electrically connected to one of the third electrode and the fourth electrode;

a first capacitor electrode connected to the second gate electrode; and a second capacitor electrode connected to the fourth electrode, wherein the third electrode is a second drain electrode, the fourth electrode is a second source electrode, and a third electrode is connected to the pixel electrode.

7. The flat panel display device of claim 6, wherein the second gate electrode and the first capacitor electrode are formed as a single body, and the fourth electrode and the second capacitor electrode are formed as a single body.

8. The flat panel display device of claim 6, wherein the first thru fourth electrodes are formed above the first gate electrode and the second gate electrode, and a gate insulating layer is further formed on an entire surface of the substrate so as to cover the first gate electrode, the second gate electrode, and the first capacitor electrode.

9. The flat panel display device of claim 8, wherein the first electrode is a first drain electrode, and the second electrode is a first source electrode.

10. The flat panel display device of claim 9, wherein the semiconductor layers are formed on the first thru fourth electrodes, a contact hole is formed in the gate insulating layer so as to expose a portion of the first capacitor electrode, a protrusion is formed in the first electrode and protrudes from the first electrode through an opening of the second electrode surrounding the first electrode in a same plane as the first electrode, and the protrusion and the first capacitor electrode are connected to each other via the contact hole.

11. The flat panel display device of claim 9, wherein the first thru fourth electrodes are formed above the semiconductor layers, a contact hole is formed in the gate insulating layer and the semiconductor layers so as to expose a portion of the first capacitor electrode, a protrusion is formed in the first electrode and protrudes from the first electrode through an opening of the second electrode surrounding the first electrode in the same plane, and the protrusion and the first capacitor electrode are connected to each other via the contact hole.

12. The flat panel display device of claim 8, wherein the first electrode is a first source electrode, and the second electrode is a first drain electrode.

13. The flat panel display device of claim 12, wherein the semiconductor layers are formed above the first thru fourth electrodes, a contact hole is formed in the gate insulating layer so as to expose a portion of the first capacitor electrode, and the second electrode and the first capacitor electrode are connected to each other via the contact hole.

14. The flat panel display device of claim 12, wherein the first thru fourth electrodes are formed on the semiconductor layers, a contact hole is formed in the gate insulating layer and the semiconductor layers so as to expose a portion of the first capacitor electrode, and the second electrode and the first capacitor electrode are connected to each other via the contact hole.

15. The flat panel display device of claim 6, further comprising a protective layer formed on an entire surface of the substrate so as to cover the first gate electrode, the second gate electrode, the first thru fourth electrodes, the first capacitor electrode, the second capacitor electrode, and the semiconductor layers, and wherein the pixel electrode is formed above the protective layer.

16. The flat panel display device of claim 1, wherein the semiconductor layers are organic semiconductor layers.

17. The flat panel display device of claim 1, wherein light generated in the display element is emitted and directed away from the substrate.

18. The flat panel display device of claim 1, wherein the display element is an electroluminescence element.

19. A thin film transistor (TFT), comprising:

a first electrode;

a second electrode partially surrounding the first electrode in which the first and second electrodes are both in a same geometric plane;

a semiconductor layer contacting the first electrode and the second electrode;

a storage capacitor connected to said electrode thin film transistor and said second electrode; and a gate electrode insulated from the first electrode, the second electrode and the semiconductor layer, wherein the first and second electrodes are formed below the gate electrode, wherein said storage capacitor is positioned between said first thin film transistor and second thin film transistor in a same geometric plane.

20. The TFT of claim 19, wherein the first and second electrodes are formed above the gate electrode.

21. The TFT of claim 19, wherein the gate electrode is disposed on a plane different from a plane of the first and second electrodes so as to correspond to a space between the first electrode and the second electrode.

22. The TFT of claim 19, further comprising a gate insulating layer for insulating the gate electrode from the first electrode, the second electrode and the semiconductor layer.

23. The TFT of claim 19, wherein the semiconductor layer is an organic semiconductor layer.

* * * * *